(12) United States Patent
Le et al.

(10) Patent No.: US 9,202,482 B2
(45) Date of Patent: Dec. 1, 2015

(54) MAGNETIC SENSOR HAVING AN EXTENDED PINNED LAYER WITH STITCHED ANTIFERROMAGNETIC PINNING LAYER

(71) Applicant: HGST Netherlands B.V., Amsterdam (NL)

(72) Inventors: Quang Le, San Jose, CA (US); Simon H. Liao, Fremont, CA (US); Guangli Liu, Pleasanton, CA (US); Kochan Ju, Monte Sereno, CA (US); Youfeng Zheng, San Jose, CA (US)

(73) Assignee: HGST Netherlands B.V., Amsterdam (NL)

( * ) Notice: Subject to any disclaimer, the term of this patent is extended or adjusted under 35 U.S.C. 154(b) by 0 days.

(21) Appl. No.: 14/011,687

(22) Filed: Aug. 27, 2013

(65) Prior Publication Data

US 2015/0062751 A1    Mar. 5, 2015

(51) Int. Cl.
    *G11B 5/39*      (2006.01)
    *G11B 5/31*      (2006.01)

(52) U.S. Cl.
    CPC .................... *G11B 5/3146* (2013.01)

(58) Field of Classification Search
    CPC ............. G11B 2005/3996; G11B 5/3903; G11B 5/3906; G11B 5/3932; G11B 5/3912; G11B 5/398; G11B 5/3929; G11B 5/3146
    USPC ...................... 360/319, 324–324.2
    See application file for complete search history.

(56) References Cited

U.S. PATENT DOCUMENTS

| | | | |
|---|---|---|---|
| 6,781,798 B2 | 8/2004 | Gill | |
| 6,870,711 B1 | 3/2005 | Zhao et al. | |
| 7,075,760 B2 | 7/2006 | Gill | |
| 7,218,486 B2 | 5/2007 | Gill | |
| 7,220,499 B2 * | 5/2007 | Saito et al. | 428/811.5 |
| 7,265,947 B2 | 9/2007 | Zheng et al. | |
| 7,327,539 B2 * | 2/2008 | Saito | 360/324.1 |
| 7,365,949 B2 * | 4/2008 | Hayakawa et al. | 360/324.1 |
| 7,369,371 B2 | 5/2008 | Freitag et al. | |
| 7,397,638 B2 | 7/2008 | Gill | |
| 7,599,155 B2 * | 10/2009 | Saito et al. | 360/324.11 |
| 8,107,202 B2 | 1/2012 | Lee et al. | |
| 8,164,862 B2 | 4/2012 | Zhang et al. | |
| 8,582,249 B2 * | 11/2013 | Sapozhnikov et al. | 360/324.11 |
| 8,619,393 B2 * | 12/2013 | Stokes | 360/324 |

(Continued)

FOREIGN PATENT DOCUMENTS

JP     2008141248 A    6/2008

OTHER PUBLICATIONS

Simmons et al., "High-Pinning Iridium—Manganese—Chromium (IrMnCr) Read Sensors for High Reliability & Stability," 2007 Hitachi Global Storage Technologies, White Paper, pp. 1-2.

*Primary Examiner* — Will J Klimowicz
(74) *Attorney, Agent, or Firm* — Zilka-Kotab, PC

(57) ABSTRACT

A magnetic sensor having a novel pinning structure resulting in a greatly reduced gap spacing. The sensor has a magnetic free layer structure that extends to a first stripe height and a magnetic pinned layer structure that extends to a second stripe height that is longer than the first stripe high. A layer of anti-ferromagnetic material is formed over the pinned layer structure in the region beyond the first stripe height location. In this way, the antiferromagnetic layer is between the pinned layer and the second or upper shield and does not contribute to gap spacing.

11 Claims, 25 Drawing Sheets

(56) References Cited

U.S. PATENT DOCUMENTS

| | | | |
|---|---|---|---|
| 8,675,318 B1 * | 3/2014 | Ho et al. | 360/324.11 |
| 8,711,528 B1 * | 4/2014 | Xiao et al. | 360/324.11 |
| 8,760,822 B1 * | 6/2014 | Li et al. | 360/324.11 |
| 2004/0061986 A1 * | 4/2004 | Kagami et al. | 360/324.11 |
| 2004/0207959 A1 * | 10/2004 | Saito | 360/324.1 |
| 2004/0207960 A1 * | 10/2004 | Saito et al. | 360/324.1 |
| 2004/0207962 A1 * | 10/2004 | Saito et al. | 360/324.11 |
| 2005/0270703 A1 * | 12/2005 | Hayakawa et al. | 360/324.1 |
| 2007/0230066 A1 * | 10/2007 | Gill | 360/324.1 |
| 2009/0168235 A1 | 7/2009 | Ju et al. | |
| 2009/0316308 A1 * | 12/2009 | Saito et al. | 360/324.1 |
| 2012/0069471 A1 | 3/2012 | Lin | |
| 2012/0134057 A1 * | 5/2012 | Song et al. | 360/319 |
| 2013/0044394 A1 * | 2/2013 | Stokes | 360/319 |

* cited by examiner

MAGNETIC SENSOR HAVING AN EXTENDED PINNED LAYER WITH STITCHED ANTIFERROMAGNETIC PINNING LAYER

FIELD OF THE INVENTION

The present invention relates to magnetic data recording and more particularly to a magnetic read sensor having improved pinned layer stability through use of an extended pinned layer structure with an antiferromagnetic layer stitched to the pinned layer in the extended region.

BACKGROUND OF THE INVENTION

The heart of a computer is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). The suspension arm biases the slider into contact with the surface of the disk when the disk is not rotating, but when the disk rotates air is swirled by the rotating disk. When the slider rides on the air bearing, the write and read heads are employed for writing magnetic impressions to and reading magnetic impressions from the rotating disk. The read and write heads are connected to processing circuitry that operates according to a computer program to implement the writing and reading functions.

The write head includes at least one coil, a write pole and one or more return poles. When a current flows through the coil, a resulting magnetic field causes a magnetic flux to flow through the write pole, which results in a magnetic write field emitting from the tip of the write pole. This magnetic field is sufficiently strong that it locally magnetizes a portion of the adjacent magnetic disk, thereby recording a bit of data. The write field, then, travels through a magnetically soft underlayer of the magnetic medium to return to the return pole of the write head.

A magnetoresistive sensor such as a Giant Magnetoresistive (GMR) sensor or a Tunnel Junction Magnetoresisive (TMR) sensor can be employed to read a magnetic signal from the magnetic media. The magnetoresistive sensor has an electrical resistance that changes in response to an external magnetic field. This change in electrical resistance can be detected by processing circuitry in order to read magnetic data from the adjacent magnetic media.

As the need for data density increases there is an ever present need to decrease the size of the magnetoresistive sensor. One way to increase the data density is to reduce the gap spacing of the sensor, which reduces the size of the magnetic bits that can be read, thereby increasing the density of data in a given track of data. However, the ability to decrease gap spacing has been limited by physical limitations such as the need for various layers within the magnetic sensor as well as limitations to reducing the size of these layers.

SUMMARY OF THE INVENTION

The present invention provides a magnetic sensor that includes a magnetic free layer structure extending from an air bearing surface to a first stripe height, and a magnetic pinned layer structure that extends from the air bearing surface to a second stripe height, the second stripe height being longer than the first stripe height. The sensor also includes a layer of antiferromagnetic material formed on and exchange coupled with the pinned layer structure only in a region beyond the first stripe height.

Both the magnetic free layer and the layer of anti-ferromagnetic material can be located between the pinned layer structure and the second or upper shield. In this way, the layer of anti-ferromagnetic material does not contribute to gap spacing. This is especially significant because, in order for the anti-ferromagnetic material to provide useful anti-ferromagnetic properties and to exchange couple with the pinned layer it must be made relatively thick and would otherwise significantly increase the gap spacing.

These and other features and advantages of the invention will be apparent upon reading of the following detailed description of preferred embodiments taken in conjunction with the figures in which like reference numerals indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION OF THE PREFERRED EMBODIMENTS

The following description is of the best embodiments presently contemplated for carrying out this invention. This description is made for the purpose of illustrating the general principles of this invention and is not meant to limit the inventive concepts claimed herein.

Figure 1:
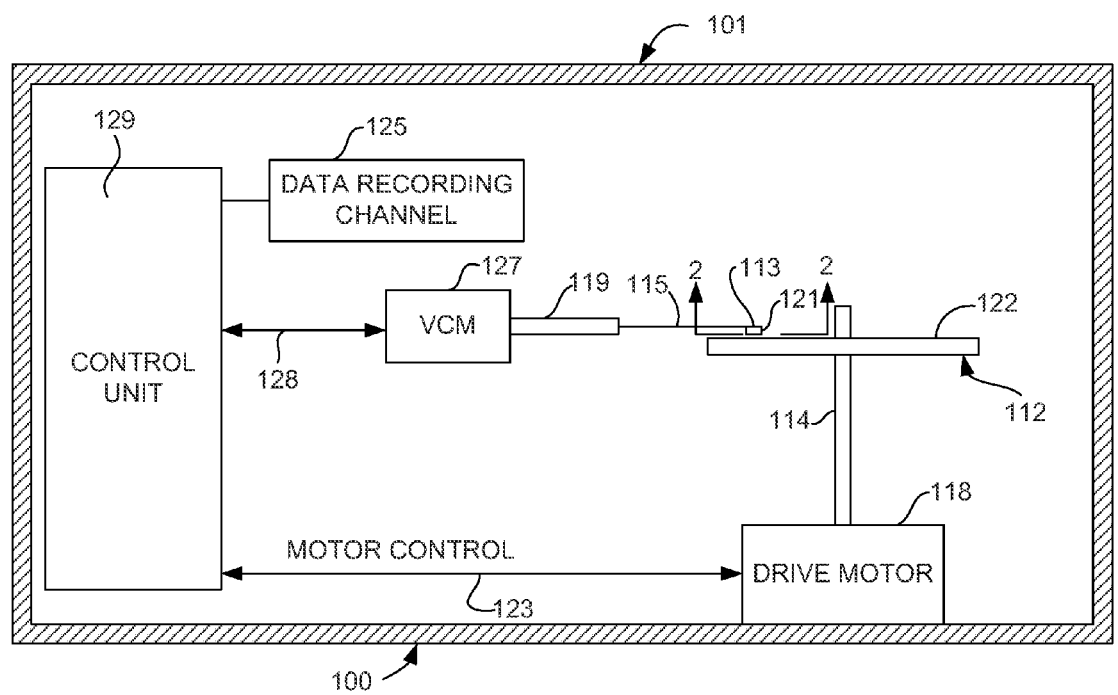
FIG. 1 is a schematic illustration of a disk drive system in which the invention might be embodied.

Referring now to FIG. 1, there is shown a disk drive 100 embodying this invention. As shown in FIG. 1, at least one rotatable magnetic disk 112 is supported on a spindle 114 and rotated by a disk drive motor 118 and mounted within a housing 101. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 can access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
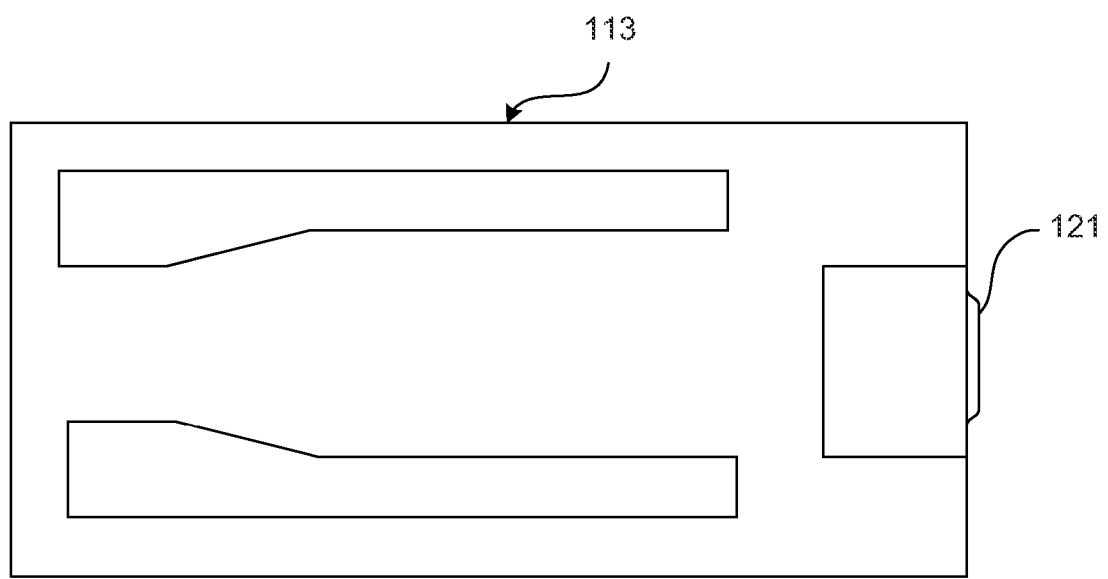
FIG. 2 is an ABS view of a slider illustrating the location of a magnetic head thereon.

With reference to FIG. 2, the orientation of the magnetic head 121 in a slider 113 can be seen in more detail. FIG. 2 is an ABS view of the slider 113, and as can be seen the magnetic head including an inductive write head and a read sensor, is located at a trailing edge of the slider. The above description of a typical magnetic disk storage system and the accompanying illustration of FIG. 1 are for representation purposes only. It should be apparent that disk storage systems may contain a large number of disks and actuators, and each actuator may support a number of sliders.

Figure 3:
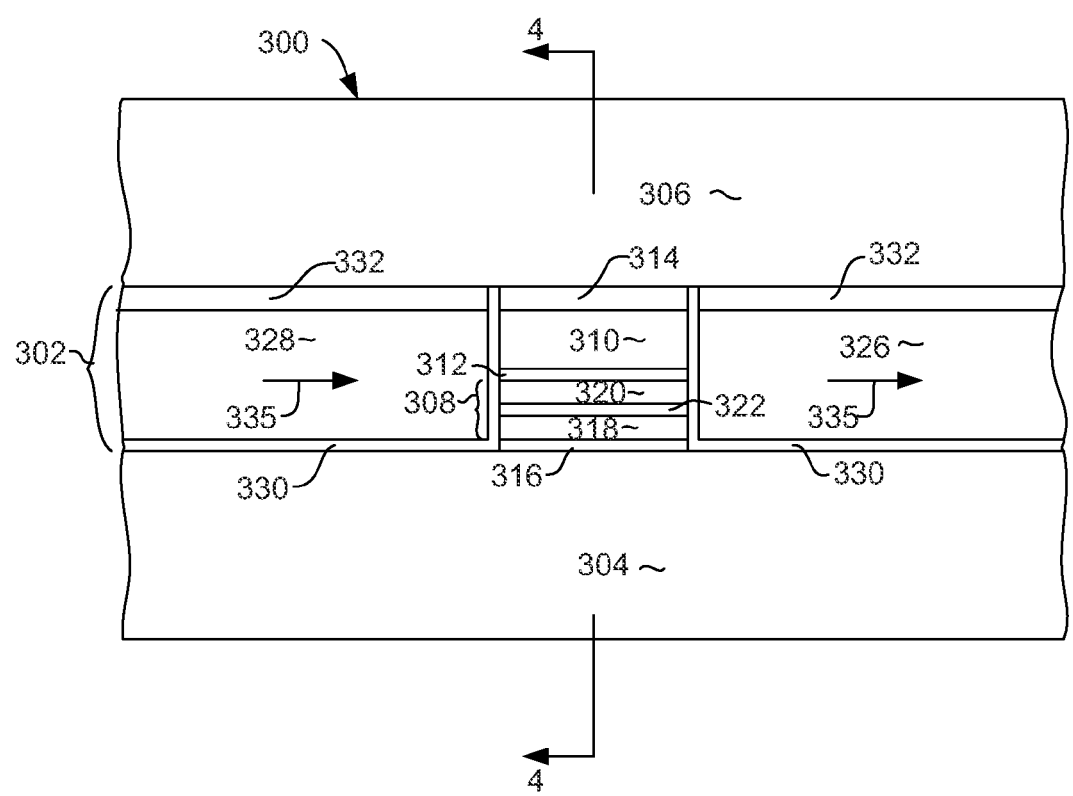
FIG. 3 is an air bearing surface view of a magnetic read sensor according to an embodiment of the invention.

FIG. 3 shows a schematic view of a magnetic read head 300 as viewed from the air bearing surface. The read head 300 includes a sensor stack 302 that is sandwiched between a leading magnetic shield 304 and a trailing magnetic shield 306. The sensor stack 302 includes a magnetic pinned layer structure 308, a magnetic free layer structure 310 and a non-magnetic barrier or spacer layer 312 sandwiched between the free and pinned layer structures 308, 310. If the sensor 300 is a tunnel junction (TMR) sensor, then the layer 312 can be a non-magnetic, electrically insulating barrier layer such as MgO. If the sensor 300 is a giant magnetoresistive (GMR) sensor, the layer 312 can be a non-magnetic, electrically conductive material such as AgSn. A capping layer 314 may be provided at the top of the sensor stack 302 to protect the under-lying layers during manufacture. A seed layer 316 may also be provided at the bottom of the sensor stack 302 to promote a desired grain structure in the other above applied layers of the sensor stack 302.

The pinned layer structure 308 can be an anti-parallel coupled structure that includes first and second magnetic layers 318, 320 that are anti-parallel coupled across a non-magnetic, anti-parallel coupling layer such as Ru 322. Pinning of the magnetic layers 318, 320 of the pinned layer structure will be described in greater detail herein below.

The free layer 310 has a magnetization that is biased in a direction that is parallel with the air bearing surface and orthogonal to the directions of magnetization of the pinned layers 318, 320, but which is free to move in response to an external magnetic field. Biasing of the magnetization of the free layer 310 can be provided by hard magnetic bias layers 326, 328, which can be constructed of a high magnetic coercivity material such as CoPt or CoPtCr. The hard bias layers 326, 328 are separated from the sensor stack 302 by non-magnetic, electrically insulating layers 330, which can be constructed of one or more layers of material such as alumina ($Al_2O_3$), SiN, TaOx, MgO, SiOxNy, or a combination thereof. A non-magnetic hard bias capping layer 332 can be provided at the top of each of the hard magnetic bias layers 326, 328. These capping layers 332 can be constructed of a material such as Ta/Ru, Ta/Cr, Ta/Rh, or a combination thereof, which protects the hard bias layers 326, 328. The hard bias layers 326, 328 have a magnetization that is oriented in a desired direction parallel with the ABS as indicated by arrows 335.

Figure 4:
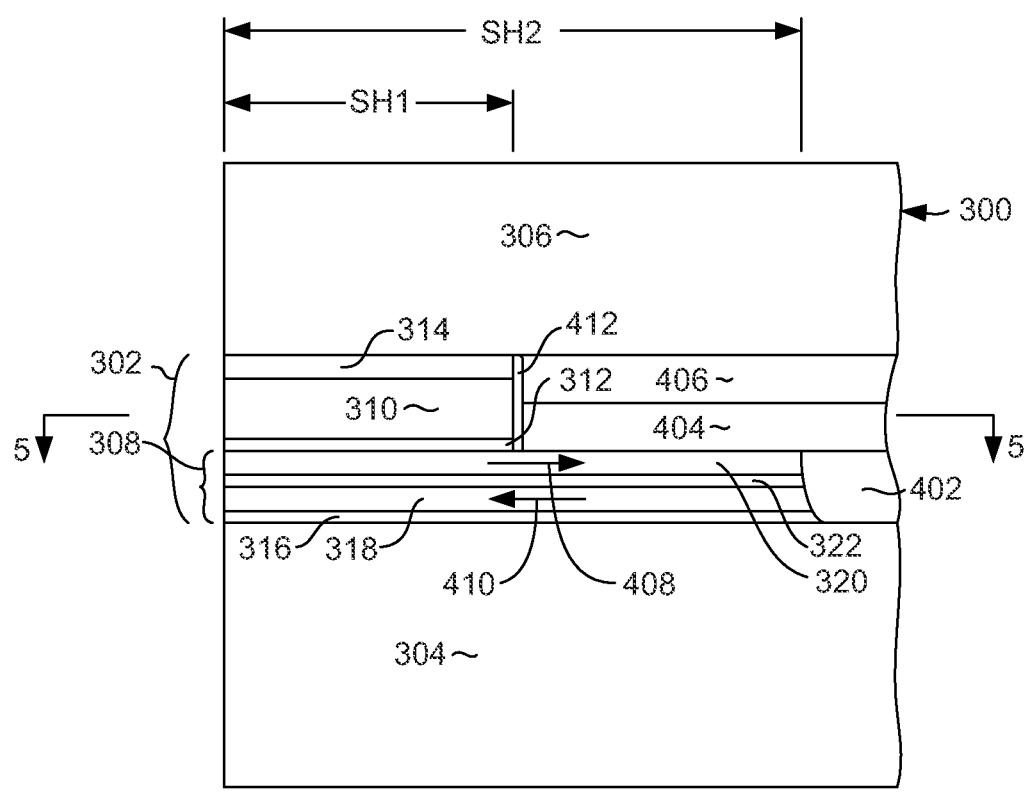
FIG. 4 is a side cross sectional view of the magnetic read sensor of FIG. 3 as seen from line 4-4 of FIG. 3.

Alternatively, magnetic biasing of the magnetization of the free layer can be provided by a soft bias structure. With such a biasing structure, the bias layers 326, 328 can be constructed of a soft magnetic (e.g. low coercivity) material such as CoFe, NiFe, or their alloys. The biasing structure 326, 328 can be magnetically coupled with the upper shield 306. A layer of antiferromagnetic material such as IrMn (not shown) can be provided either within the shield or within the soft bias layers to align the magnetization in a desired direction parallel with the air bearing surface FIG. 4 shows a side cross sectional view of the sensor 300. As can be seen in FIG. 4, the free layer 310 and capping layer 314 extend to a first stripe height SH1, whereas the pinned layer structure 308 extends further to a second strip height SH2. The first stripe height SH1 defines the functional stripe height of the sensor. The space behind the pinned layer structure 308 can be filled with a non-magnetic, electrically insulating material such as alumina 402.

With continued reference to FIG. 4, a layer of antiferromagnetic material (AFM) 404 is formed on top of the portion of the pinned layer structure 308 that extends beyond the first stripe height SH1. The AFM layer 404 contacts and is exchange coupled with the upper magnetic layer 320 of the pinned layer structure 308. This exchange coupling pins the magnetization of the magnetic layer 320 in a first direction that is perpendicular to the air bearing surface ABS as indicated by arrow 408. The anti-parallel coupling between the magnetic layers 318 and 320 causes the other magnetic layer 320 to be pinned in a second direction that is also perpendicular to the air bearing surface and anti-parallel to the first direction as indicated by arrow 410.

The AFM layer can be separated from the back edge of the free layer 310 and capping layer 314 by a non-magnetic electrically insulating spacer 412. In addition, a non-magnetic, electrically insulating layer 406 can be provided over the top of the AFM layer 404 to separate the AFM layer 404 from the upper (or trailing) shield 306. The layers 412 and 406 can be constructed of a material such as alumina ($Al_2O_3$).

Figure 5:
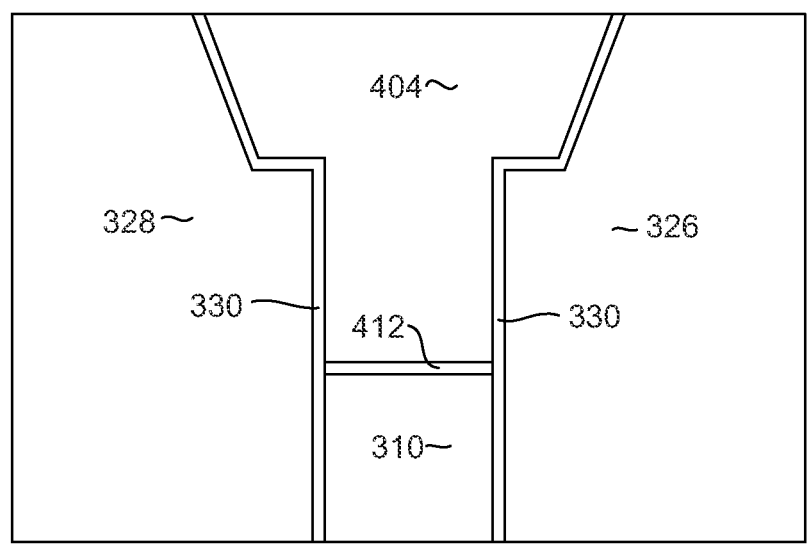
FIG. 5 is a top down view of the sensor of FIGS. 3 and 4 as seen from line 5-5 of FIG. 4.
Figure 5A:
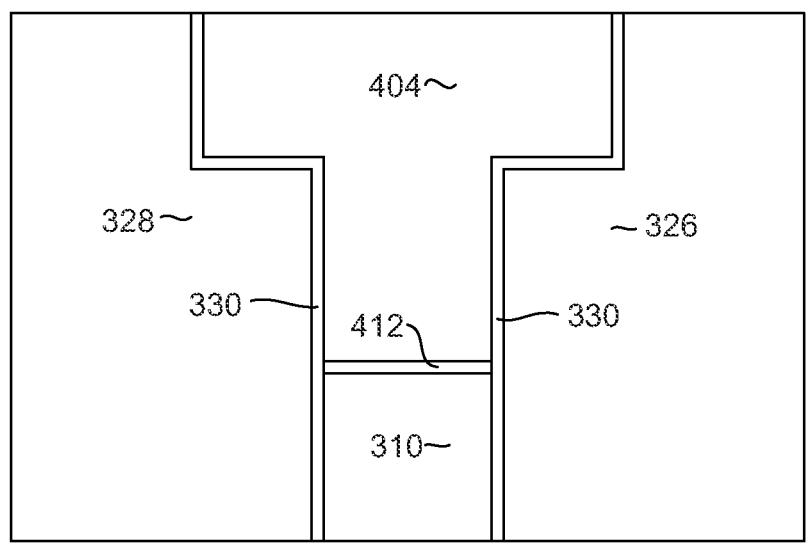
FIG. 5a is a top down view similar to that of FIG. 5, illustrating an alternate embodiment of the invention.

FIG. 5 shows a top down sectional view as seen from line 5-5 of FIG. 4. As can be seen in FIG. 5, the portion of the pinned layer 308 (not seen in FIG. 5) that extends beyond the back edge of the free layer 310 and the AFM 404 can be formed with a flared shape to increase the area of contact between the AFM 404 and the pinned layer 308, thereby improving the exchange coupling and consequent pinning of the pinned layer structure 308. The pinned layer 308 cannot be seen in FIG. 5, because it is hidden beneath the AFM 404. In FIG. 5, the back portion of the AFM 404 and pinned layer structure 308 there-under steps laterally outward at the sides before tapering backward. FIG. 5a shows yet another variation where the portion of the pinned layer 308 extending beyond the free layer 310 and the AFM 404 step laterally outward at the sides and then straight back to define a substantially 90 degree angle at their outer corners.

Figure 6:
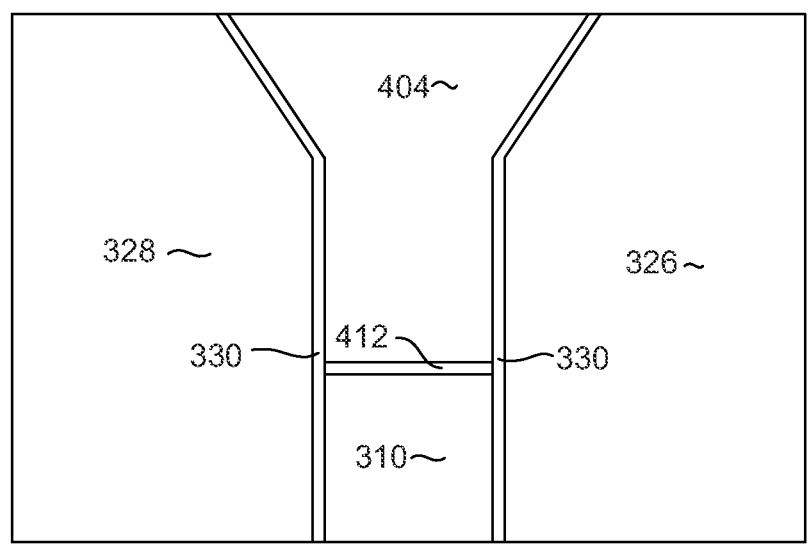
FIG. 6 is a top down view similar to that of FIG. 5, illustrating another embodiment of the invention.
Figure 6A:
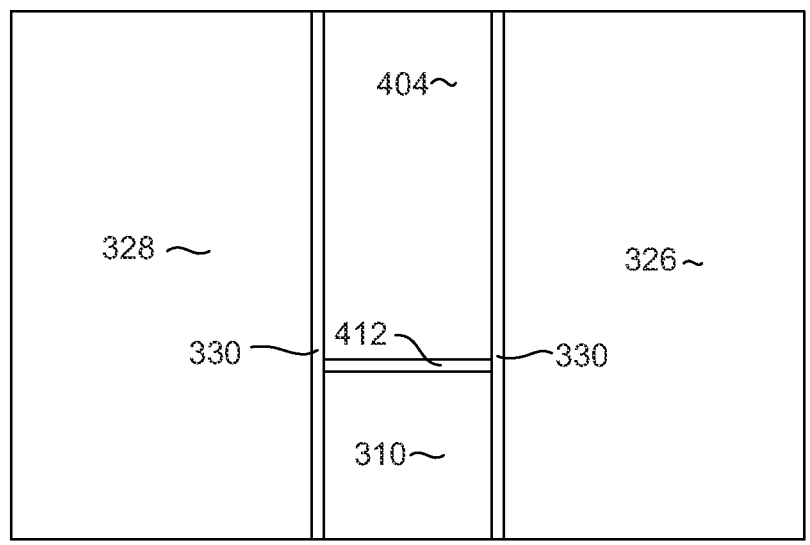
FIG. 6a is a top down view similar to that of FIG. 5, illustrating yet another embodiment of the invention.

FIG. 6 shows an alternate embodiment wherein the AFM 404 and pinned layer structure 308 hidden there-under do not have the stepped shape, but rather transition from the backward extending shape directly to a tapered shape. Alternatively, FIG. 6a shows yet another embodiment, wherein the AFM 404 pinned layer structure 308 hidden there-under extend straight back from the active area of the sensor.

The above described sensor design greatly improves data density by significantly reducing the gap spacing. In prior art sensor designs, an AFM layer was located within the sensors stack beneath the pinned layer structure and contributed to the gap spacing of the sensor. In order for an AFM layer to exhibit the necessary anti-ferromagnetic and exchange coupling properties necessary for pinning the pinned layer, the AFM layer has to be substantially thick. Therefore, the AFM layer in such prior art designs was a significant contributor to the gap spacing budget.

The present invention, however completely avoids this addition to gap spacing by placing the AFM layer behind the free layer as described above. The AFM layer 404, therefore, does not contribute to the gap budget at all. In addition, the shape enhanced pinning provided by extending the pinned layer additionally assists pinning of the pinned layer structure 308, (FIG. 4) thereby improving the robustness and reliability of the sensor 300.

Figure 7:
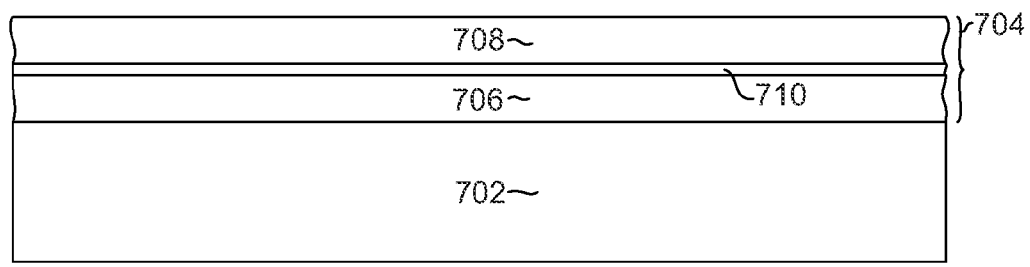
FIGS. 7-23 are views of a magnetic sensor in various intermediate stages of manufacture, illustrating a method of manufacturing a magnetic read sensor according to an embodiment of the invention.

FIGS. 7-23 show a magnetic sensor in various stages of manufacture in order to illustrate a method for manufacturing a magnetic sensor such as that described above. With particular reference to FIG. 7, a bottom shield 702 is formed. The bottom shield 702 can be an electrically conductive, magnetic material such as NiFe, and can be formed by electroplating. Then, a series of sensor layers 704 are deposited full film over the shield. The sensor layers 704 include a pinned layer structure 706, a non-magnetic spacer or barrier layer 710 and a free layer and capping layer 708. These layers 704 can correspond to the layers of the sensor 300 described above, but could include other variations in the sensor structure as well.

Figure 8:
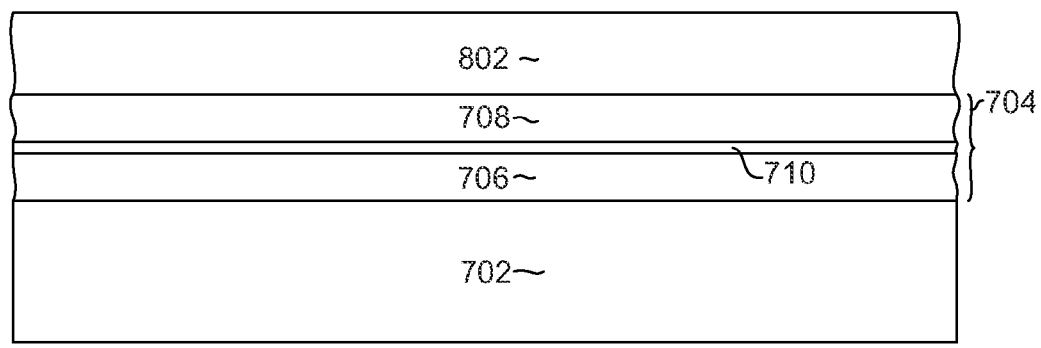
Figure 9:
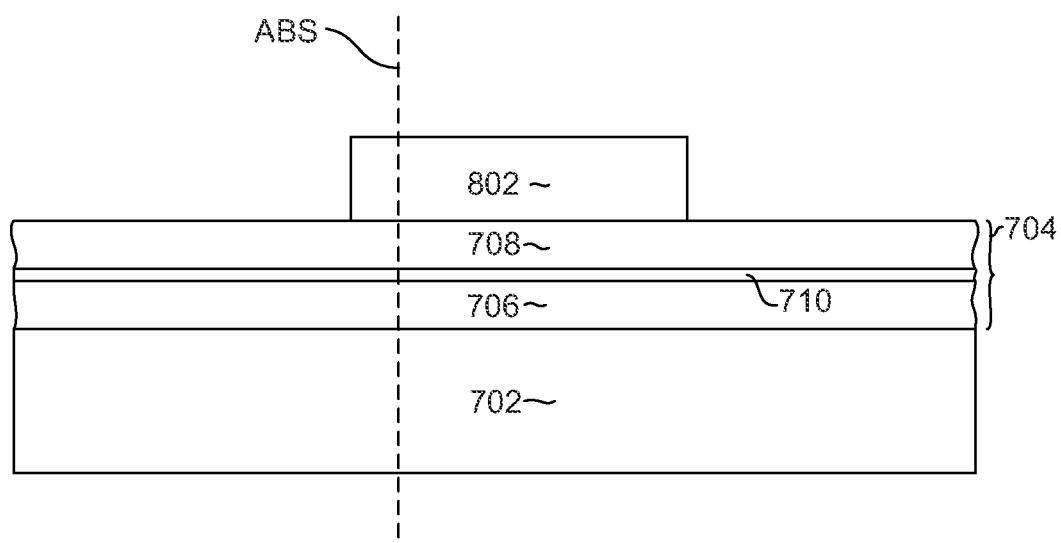

Then, with reference to FIG. 8 a mask layer 802 is formed over the series of sensor layers 704. The mask layer 802 includes a layer of photoresist, but could include other layers as well, such as a hard mask layer, release layer, anti-reflective coating layer, etc. With reference now to FIG. 9, the photoresist layer is patterned to form a mask 802 having edges that are located so as to define a first stripe height (SH1 in FIG. 4) relative to an air bearing surface plane, the location of which is represented in FIG. 9 by the dashed line denoted as ABS.

Figure 10:
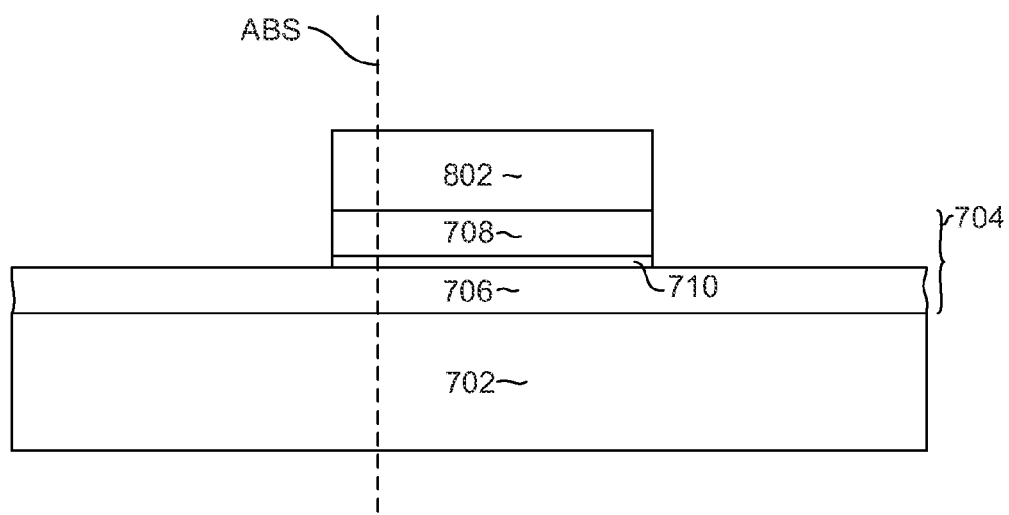

After the mask 802 has been defined, a first ion milling can be performed to remove portions of the free layer 708 and non-magnetic barrier or space layer 710, stopping at some point within the pinned layer structure 706, leaving a structure as shown in FIG. 10. An end point detection method such as Secondary Ion Mass Spectrometry (SIMS) can be used to detect when the non-magnetic barrier or spacer layer 710 of the sensor stack 704 has been reached.

Figure 11:
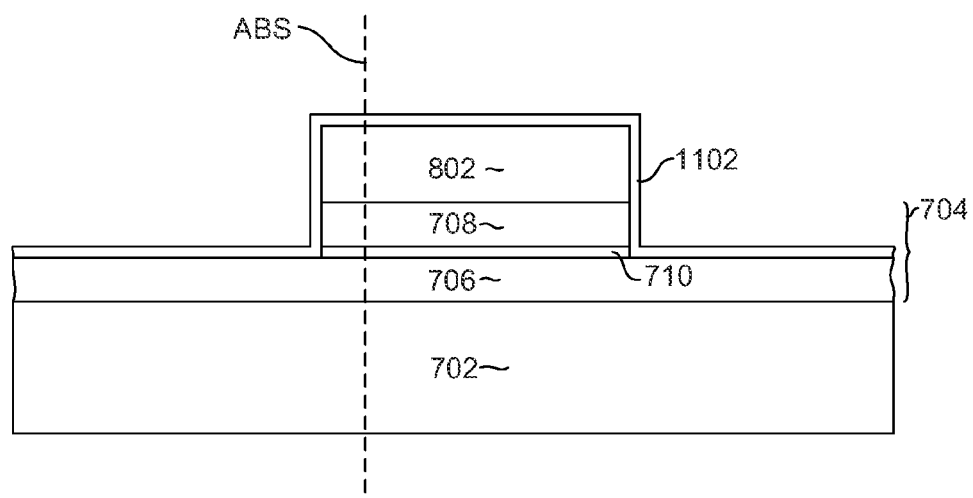

Then, with reference to FIG. 11, in one embodiment, a thin layer of non-magnetic, electrically insulating material 1102 is deposited. The layer 1102 is preferably alumina and is preferably deposited by a conformal deposition method such room temperature ion beam deposition (IBD) or atomic layer deposition so that it deposits well on the sides of the free layer 708. The layer 1102 is preferably deposited to a thickness of about 20 Angstroms. The first ion milling and deposition of the thin layer of non-magnetic, electrically insulating material 1102 can be performed in situ in a chamber of a deposition/ion milling tool without breaking vacuum.

Figure 12:
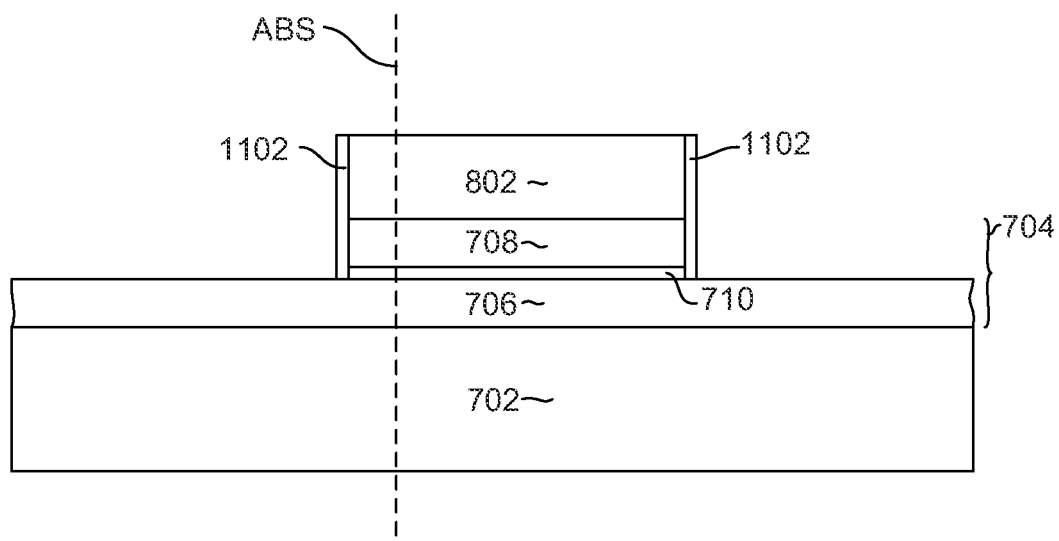

Then, a second ion milling is performed to preferentially remove horizontally disposed portions of the layer insulation layer 1102, leaving a structure as shown in FIG. 12 with a side wall 1102 formed at the edges of the free layer 708 and removing the insulation layer 1102 from the area over the pinned layer structure 706.

Figure 13:
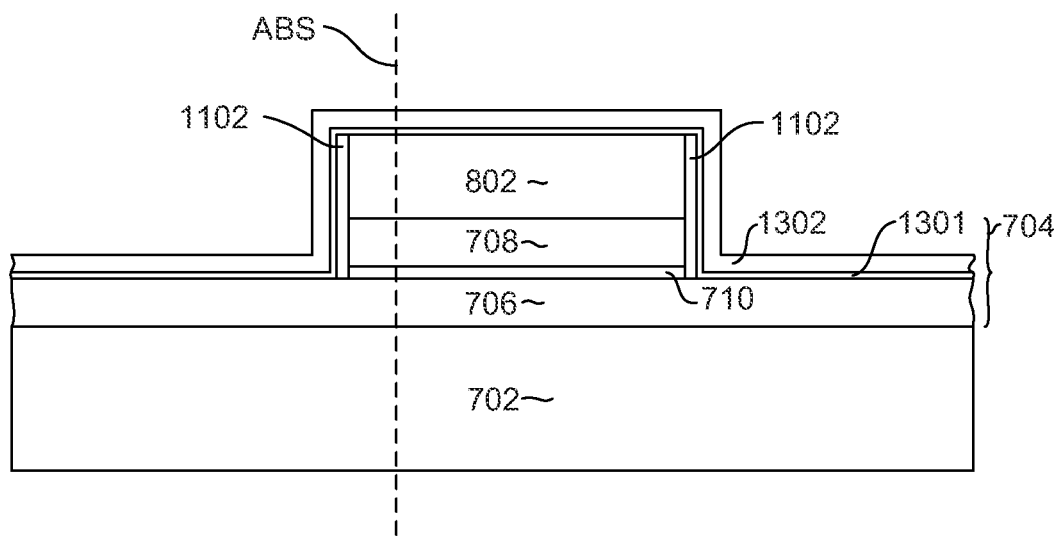
Figure 14:
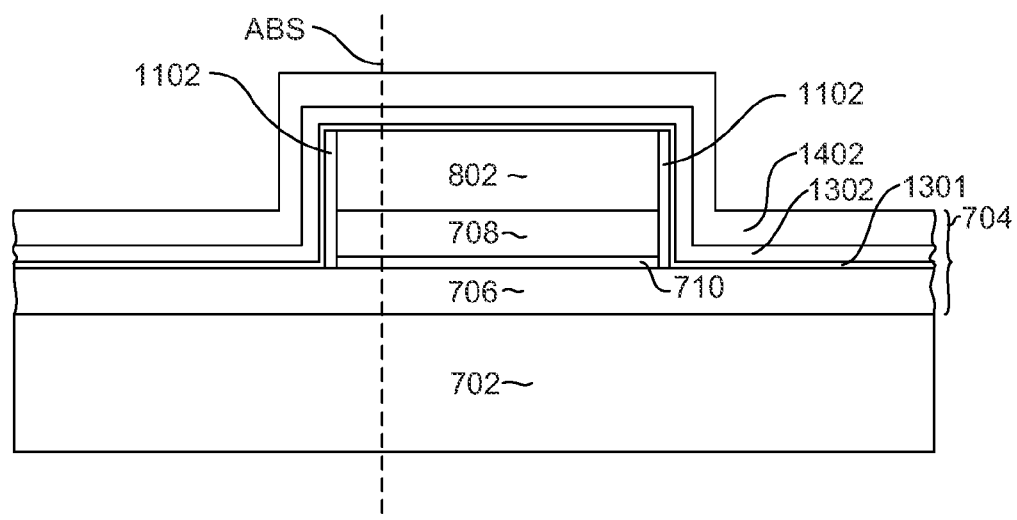

With reference to FIG. 13, a layer of magnetic material matching the etched pinned layer material 1301 is deposited and a layer of antiferomagnetic material 1302 is then deposited over the layer 1301. The layer 1301 can be deposited by sputter deposition or IBD in a first module then the wafer can be transferred to another module for deposition of the layer AFM layer 1302. The AFM layer 1302 is preferably IrMn and can be deposited by sputter deposition. A non-magnetic, electrically insulating fill layer 1402 is then deposited over the AFM layer 1302 as shown in FIG. 14. The fill layer 1402 is preferably alumina ($Al_2O_3$) and can be deposited by sputter deposition, ion beam deposition or atomic layer deposition for conformal coverage.

The first ion milling, deposition of the layer 1301 and deposition of the layer 1302 can all be done in an integrated tool without breaking vacuum. Moreover the deposition of the layer 1301 can be used to cover the resist mask 802 prior to depositing the AFM layer 1302. The deposition of the AFM layer 1302 can be performed using an Anelva® tool, which cannot be used with the resist layer 1302 exposed. The glass transition temperature of the resist mask 802 should be higher than the temperature necessary for deposition of the AFM 1302 in order to prevent out-gassing, which could contaminate the tool. Moreover, deposition of the layer 1402 encapsulates the AFM layer 1302, protecting it from corrosion during subsequent processing.

Figure 15:
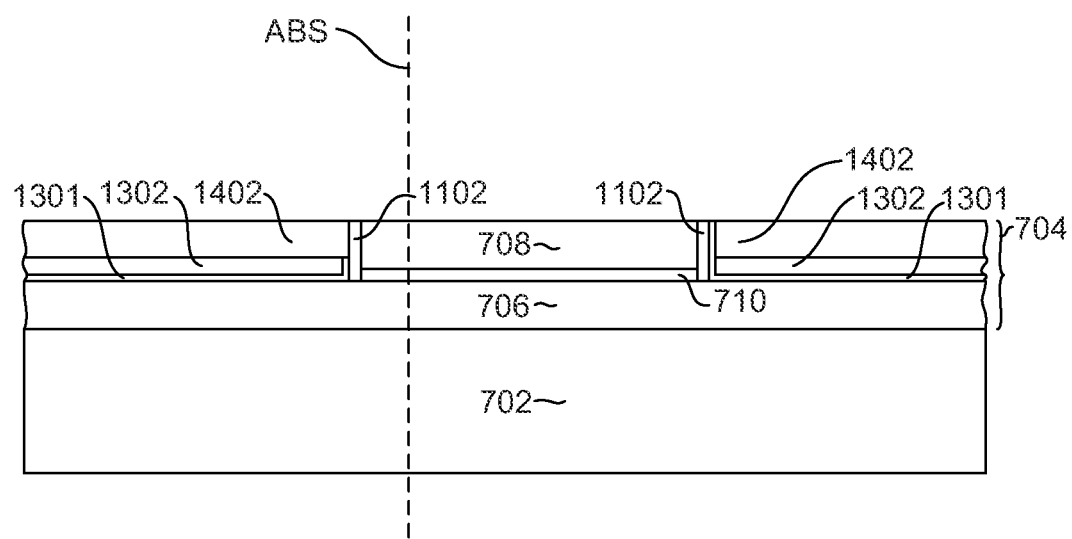

One or more processes can then be performed to remove the mask 802 and planarize the structure, leaving a structure as shown in FIG. 15. This can include depositing a CMP stop layer such as carbon (not shown), performing wrinkle bake or glancing angle ion milling followed by a chemical lift off to remove the mask 802, performing a chemical mechanical polishing for planarization, and then performing a reactive ion etching (RIE) to remove the CMP stop layer (e.g. carbon).

Figure 16:
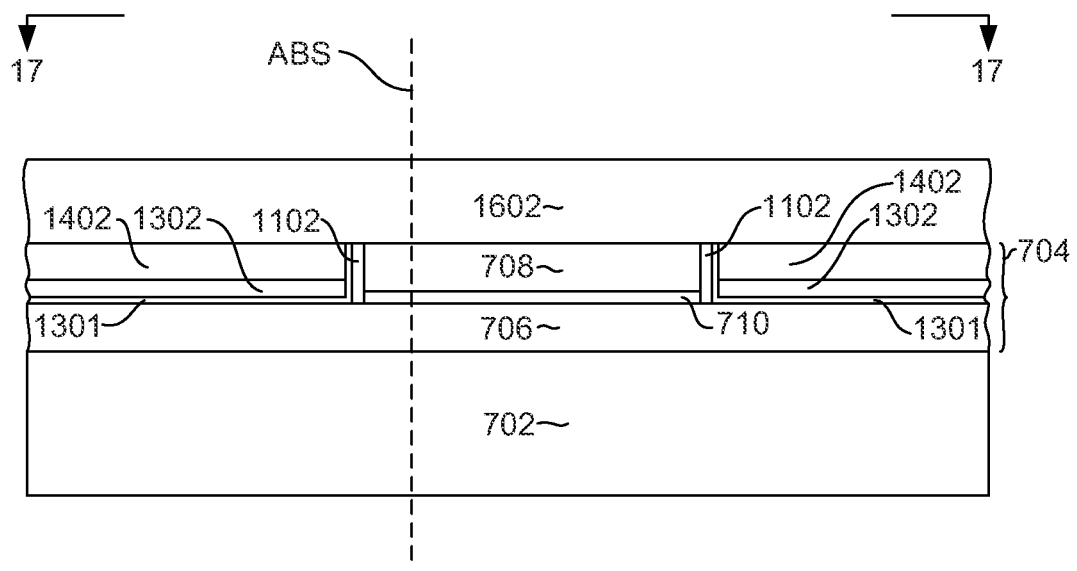
Figure 17:
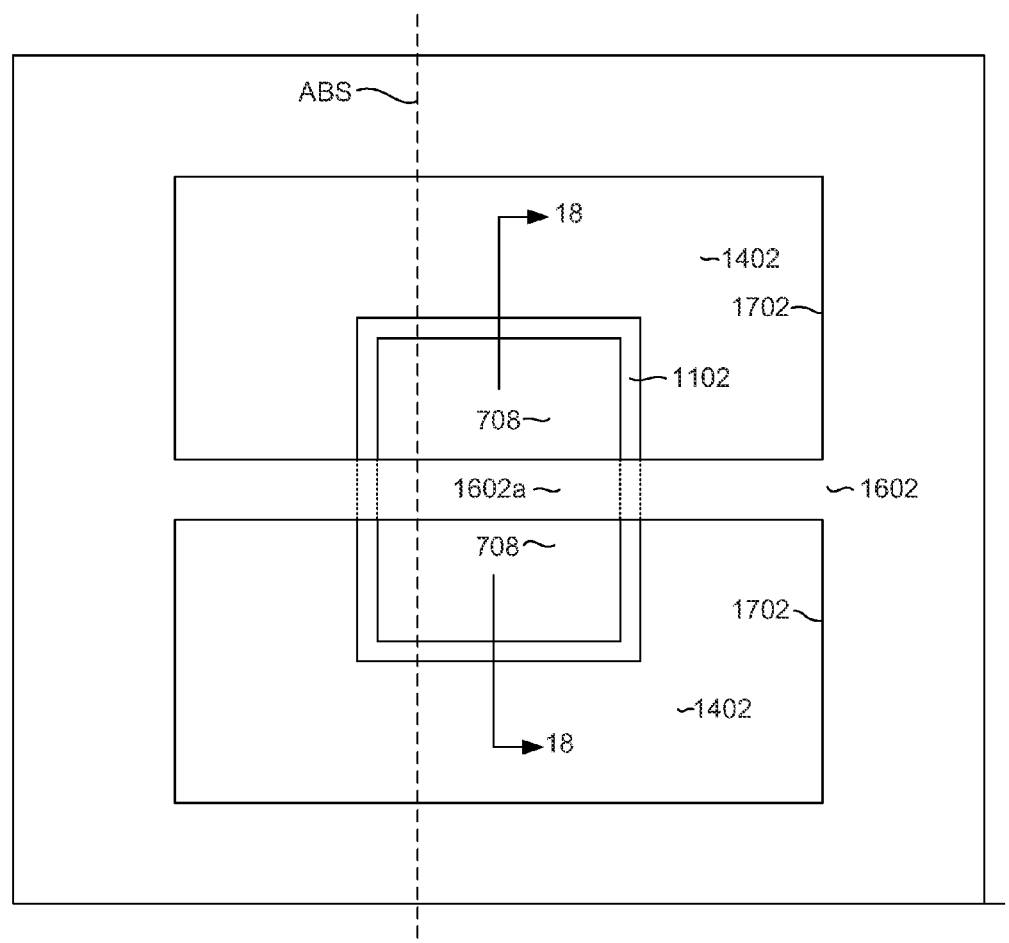

After the above processes have been performed to define the free layer stripe height and form the AFM 1302 as described above, another masking and milling operation can be performed to define the track width of the sensor. As shown in FIG. 16, one or more mask layers 1602 are deposited over the structure. The mask layers 1602 are then patterned so as to form a track-width defining mask. The configuration of such a track width defining mask 1602 can be seen more clearly with reference to FIG. 17 which shows a top down view as seen from line 17-17 of FIG. 16. As shown in FIG. 17, the mask 1602 has opening 1702 through which the underlying structure is exposed. The mask 1602 can be configured to construct various pinned layer shapes as shown and discussed above with reference to FIGS. 5, 5a, 6, and 6a. By using different shapes, the amount of AFM stitching (e.g. contact) between the AFM layer 1302 and pinned layer 706 can be controlled. The mask 1602, has a portion 1602a between the openings that can define a track-width of the sensor. The orientation of the air bearing surface plane relative to the mask 1602 is indicated by the dashed line denoted ABS in FIG. 17.

Figure 18:
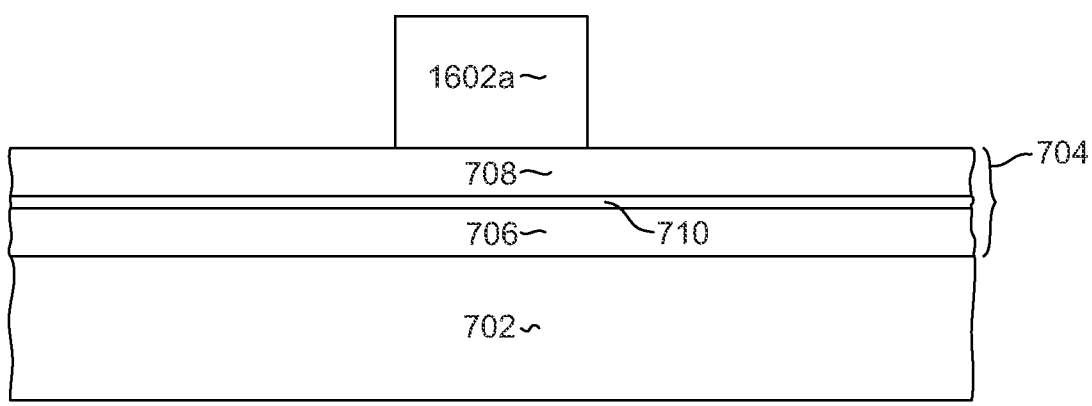

FIG. 18 shows a cross sectional view of a plane parallel with the ABS as taken from line 18-18 of FIG. 17, and shows the mask portion 1602a over the sensor layers 706, 710, 708.

Figure 19:
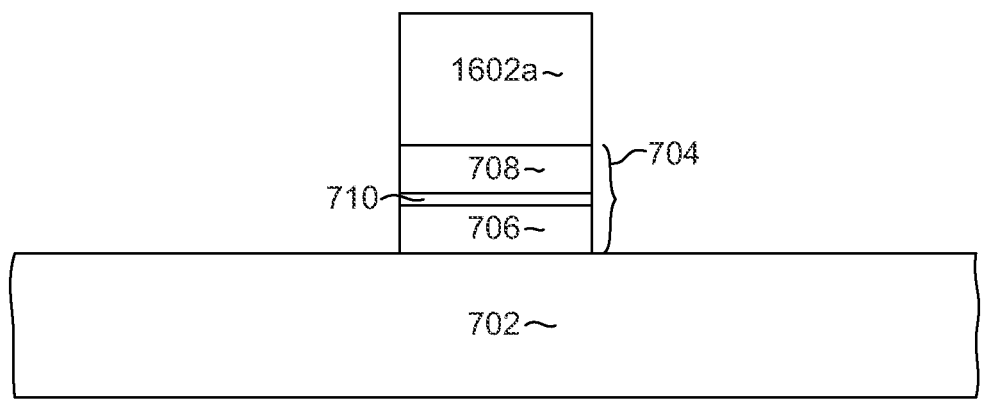

A third ion milling can be performed to remove portions of the sensor layers 706, 710, 708 that are not protected by the mask 1602*a*. This ion milling can be a full milling that removes the pinned layer structure 706 as well as the free layer structure 708, as shown in FIG. 19 or could be a partial milling, terminating at the pinned layer 706.

Figure 20:
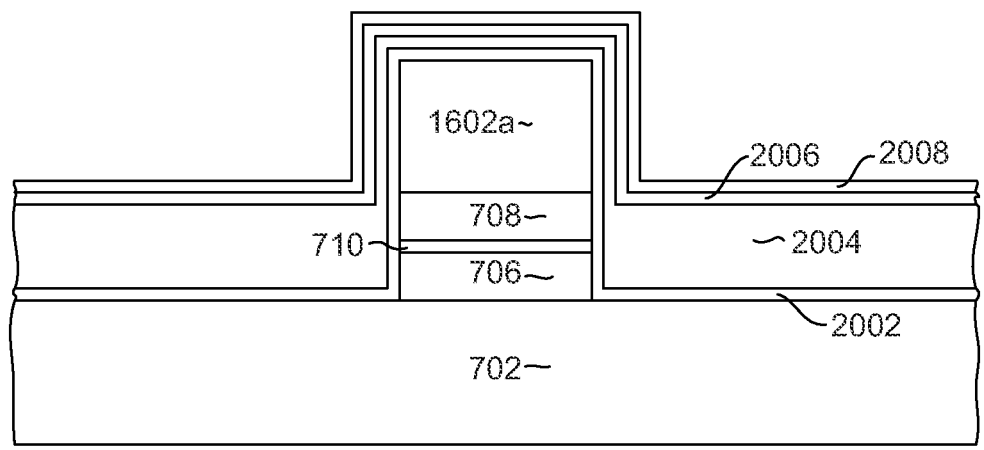

With reference now to FIG. 20, a thin layer of non-magnetic, electrically insulating material such as alumina ($Al_2O_3$) 2002 is deposited, preferably by atomic layer deposition or SiN can be deposited by IBD. Then, a layer magnetic material 2004 such as CoPt or CoPtCr is deposited over the thin insulation layer 2002 to provide a magnetic bias layer. A bias capping layer 2006 such as Ta or Rh can then be deposited over the hard bias layer 2004, followed by a chemical mechanical polishing stop layer such as carbon or diamond like carbon 2008. Alternatively, the bias material layer 2004 can be a soft magnetic material such as NiFe, CoFe or alloys thereof. In that case, the upper magnetic shield (not yet formed or shown) could include a layer of antiferromagnetic material such as IrMn in order to control the magnetization of the bias layer 2004.

Figure 21:
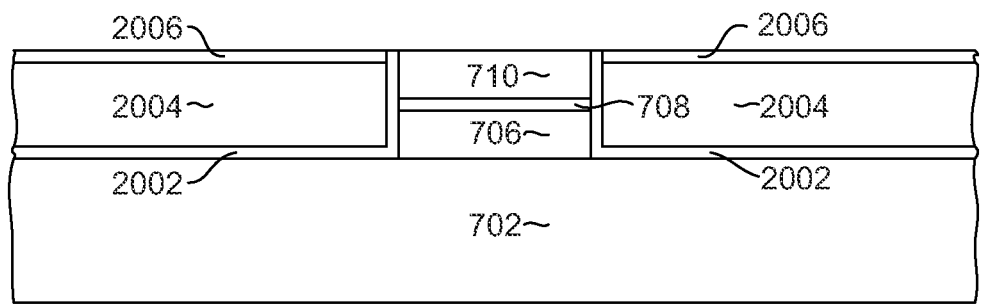

A second liftoff and planarization process is then performed to remove the mask 1602 and planarize the structure, leaving a structure as shown in FIG. 21. As previously described, this liftoff and planarization process can include: a wrinkle bake and/or glancing ion milling; chemical liftoff; and chemical mechanical polishing. A reactive ion etching can be performed to remove the chemical mechanical polishing stop layer 2008.

Figure 22:
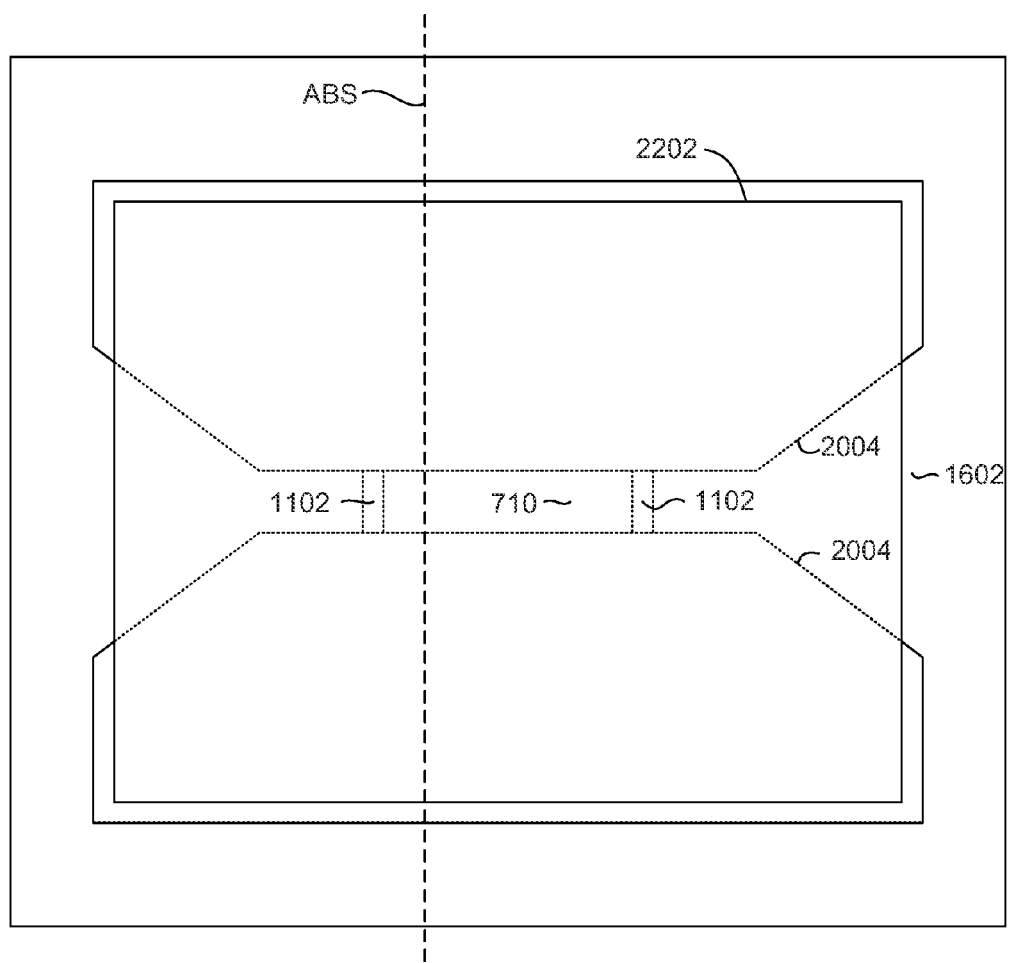
Figure 23:
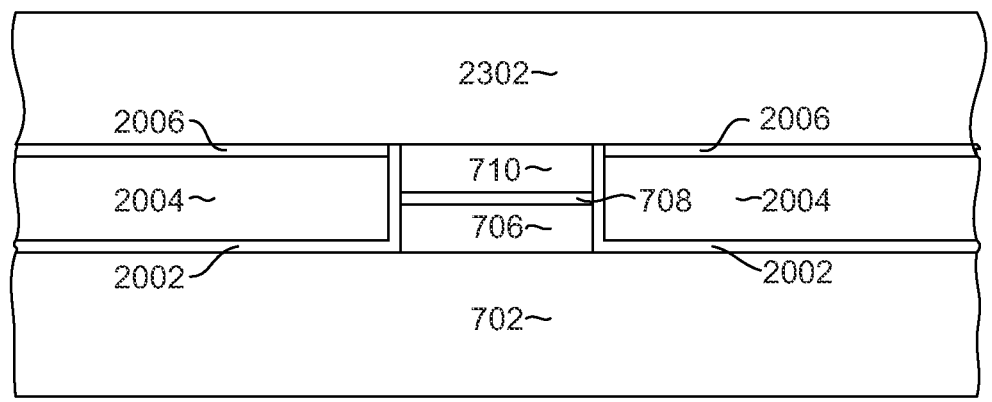

With reference now to FIG. 22, a third series of masking, ion milling and liftoff processes can be performed to remove material from the field area (area removed from the sensor) and to define a back edge (stripe height) of the AFM layer 1302 and pinned layer 706. FIG. 22 shows a top down view, showing the configuration of a mask 2202 used for such as process. This mask 2202 is preferably a bi-layer mask having an overhang to allow for easier liftoff. After forming the mask 2202, an ion milling can be performed to remove material not protected by the mask 2202. Then, a refill material such as alumina (not shown in FIG. 22) can be deposited and a lift off and planarization process can be performed similar to that discussed above for the other liftoff processes. Then, with reference to FIG. 23 an upper shield 2302 can be formed over the sensor such as by electroplating a magnetic material such as NiFe.

The configuration of the bias layers 2004 can be controlled by the order of the build. For example, if the stripe height of the free layer structure 708 is defined before the trackwidth of the sensor, then the stripe height of the hard bias structure 2004 will be determined by the third masking and ion milling process (that which defines the stripe height of the pinned layer 706 and AFM 1302). On the other hand, if the track width is defined before the stripe height of the free layer 708, then the stripe height of the bias structures will be determined by the masking and ion milling process that defines the stripe height of the free layer 708. In that case, the bias structure 1302 will have a back edge that is self-aligned with the back edge of the free layer 708.

While various embodiments have been described above, it should be understood that they have been presented by way of example only and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A magnetic sensor, comprising:
   a magnetic free layer structure extending from an air bearing surface to a back edge located at a first stripe height;
   a magnetic pinned layer structure extending from the air bearing surface to a second stripe height, the second stripe height being longer than the first stripe height;
   a layer of magnetic material formed on the magnetic pinned layer structure only in a region beyond the first stripe height;
   a layer of antiferromagnetic material formed on and exchange coupled with the layer of magnetic material that is formed on the pinned layer structure only in the region beyond the first stripe height, the layer of antiferromagnetic material having a front edge; and
   a non-magnetic, electrically insulating wall formed on the back edge of the free layer structure, the non-magnetic, electrically insulating wall being located between and contacting both the back edge of the free layer structure and a front edge of the layer of magnetic material, wherein a back edge of the layer of magnetic material, parallel to the front edge, contacts the antiferromagnetic material.

2. The magnetic sensor as in claim 1 further comprising first and second electrically conductive magnetic shields, the free layer structure, pinned layer structure and layer of antiferromagnetic material being located between the first and second electrically conductive, magnetic shields.

3. The magnetic sensor as in claim 2 wherein both the magnetic free layer structure and the layer of antiferromagnetic material are located between the pinned layer structure and the second electrically conductive, magnetic shield.

4. The magnetic sensor as in claim 3 wherein the layer of antiferromagnetic material comprises IrMn.

5. The magnetic sensor as in claim 1, wherein the magnetic pinned layer structure has a width that is aligned with the magnetic free layer structure in a region adjacent to the magnetic free layer structure.

6. The magnetic sensor as in claim 5, wherein the magnetic pinned layer structure tapers laterally outward in the region removed from the magnetic free layer structure.

7. The magnetic sensor as in claim 5 wherein the magnetic pinned layer structure steps laterally outward in the region removed from the magnetic free layer structure.

8. A magnetic data recording system, comprising:
   a housing;
   a magnetic media mounted within the housing;
   an actuator; and
   a slider connected with the actuator for movement adjacent to a surface of the magnetic media, the slider having a magnetic sensor formed thereon, the magnetic sensor further comprising:
   a magnetic free layer structure extending from an air bearing surface to a back edge located at a first stripe height;
   a magnetic pinned layer structure extending from the air bearing surface to a second stripe height, the second stripe height being longer than the first stripe height;
   a layer of magnetic material formed on the magnetic pinned layer structure only in a region beyond the first stripe height;
   a layer of antiferromagnetic material formed on and exchange coupled with the layer of magnetic material that is formed on the pinned layer structure only in the region beyond the first stripe height, the layer of antiferromagnetic material having a front edge; and
   a non-magnetic, electrically insulating wall formed on the back edge of the free layer structure, the non-magnetic, electrically insulating wall being located between and contacting both the back edge of the free layer structure and a front edge of the layer of magnetic material, wherein a back edge of the layer of magnetic material, parallel to the front edge, contacts the antiferromagnetic material.

9. The magnetic data recording system as in claim 8 further comprising first and second electrically conductive magnetic shields, the free layer structure, pinned layer structure and layer of antiferromagnetic material being located between the first and second electrically conductive, magnetic shields.

10. The magnetic data recording system as in claim 9, wherein both the magnetic free layer structure and the layer of antiferromagnetic material are located between the pinned layer structure and the second electrically conductive, magnetic shield.

11. The magnetic data recording system as in claim 10, wherein the layer of antiferromagnetic material comprises IrMn.

* * * * *